(12) United States Patent
Pyo et al.

(10) Patent No.: US 10,910,587 B2
(45) Date of Patent: Feb. 2, 2021

(54) ORGANIC LIGHT EMITTING DIODE DISPLAY DEVICE

(71) Applicant: SAMSUNG DISPLAY CO., LTD., Yongin-si (KR)

(72) Inventors: Sangwoo Pyo, Yongin-si (KR); ILsoo Oh, Yongin-si (KR); Jihwan Yoon, Yongin-si (KR); Changmin Lee, Yongin-si (KR); Sungjin Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 57 days.

(21) Appl. No.: 15/730,847

(22) Filed: Oct. 12, 2017

(65) Prior Publication Data

US 2018/0102499 A1   Apr. 12, 2018

(30) Foreign Application Priority Data

Oct. 12, 2016   (KR) .......................... 10-2016-0132154

(51) Int. Cl.
*H01L 51/52* (2006.01)
*H01L 51/50* (2006.01)
*H01L 27/32* (2006.01)

(52) U.S. Cl.
CPC ...... *H01L 51/5228* (2013.01); *H01L 51/5044* (2013.01); *H01L 51/5056* (2013.01); *H01L 51/5212* (2013.01); *H01L 27/3246* (2013.01); *H01L 51/5237* (2013.01); *H01L 51/5271* (2013.01); *H01L 51/5275* (2013.01)

(58) Field of Classification Search
None
See application file for complete search history.

(56) References Cited

U.S. PATENT DOCUMENTS

| 7,990,050 B2 | 8/2011 | Eom |
| 9,048,456 B2 | 6/2015 | Chang et al. |
| 2009/0315458 A1* | 12/2009 | Choi ................... H01L 27/3276 313/505 |
| 2010/0060147 A1* | 3/2010 | Eom ................... H01L 51/5234 313/504 |
| 2013/0204003 A1* | 8/2013 | Osaka ................. H01L 51/0072 546/276.7 |
| 2015/0090986 A1 | 4/2015 | Toyoda et al. |

(Continued)

FOREIGN PATENT DOCUMENTS

| JP | 2015-69757 A | 4/2015 |
| KR | 10-2010-0028925 A | 3/2010 |

(Continued)

*Primary Examiner* — Davienne N Monbleau
*Assistant Examiner* — Scott R Wilson
(74) *Attorney, Agent, or Firm* — Lewis Roca Rothgerber Christie LLP (57) ABSTRACT

An organic light emitting diode display device includes an auxiliary electrode spaced apart from a plurality of first electrodes on a substrate. A first light emitting portion is on the first electrode. A charge generation layer is on the first light emitting portion. A second light emitting portion is on the charge generation layer. A second electrode is on the second light emitting portion and is electrically connected to the auxiliary electrode. The second electrode is insulated from the charge generation layer.

15 Claims, 10 Drawing Sheets

(56) References Cited

U.S. PATENT DOCUMENTS

| | | | |
|---|---|---|---|
| 2016/0126498 A1* | 5/2016 | Kim | H01L 51/5253 257/40 |
| 2016/0190505 A1* | 6/2016 | Koo | H01L 51/5228 257/40 |
| 2016/0190521 A1* | 6/2016 | Lee | H01L 51/5278 257/40 |

FOREIGN PATENT DOCUMENTS

| | | |
|---|---|---|
| KR | 10-2013-0007308 A | 1/2013 |
| KR | 10-2013-0072032 A | 7/2013 |
| KR | 10-2016-0079978 A | 7/2016 |

* cited by examiner

ORGANIC LIGHT EMITTING DIODE DISPLAY DEVICE

CROSS-REFERENCE TO RELATED APPLICATION

Korean Patent Application No. 10-2016-0132154, filed on Oct. 12, 2016, and entitled, "Organic Light Emitting Diode Display Device," is incorporated by reference herein in its entirety.

BACKGROUND

1. Field

One or more embodiments described herein relate to an organic light emitting diode display device.

2. Description of the Related Art

Many types of displays have been developed. Examples include liquid crystal displays, organic light emitting diode (OLED) displays, plasma display panels, and electrophoretic displays. An OLED display has excellent contrast ratio and response time and is easy to be implement as a flexible display. However, improvements are needed.

SUMMARY

In accordance with one or more embodiments, an organic light emitting diode display device includes a substrate; a plurality of first electrodes on the substrate; an auxiliary electrode on the substrate and spaced apart from the first electrodes; a first light emitting portion on the first electrode; a first charge generation layer on the first light emitting portion; a second light emitting portion on the first charge generation layer; and a second electrode on the second light emitting portion and electrically connected to the auxiliary electrode, wherein the second electrode is insulated from the first charge generation layer.

The first charge generation layer may not contact the second electrode. The auxiliary electrode may be between at least two of the first electrodes. The first electrodes and the auxiliary electrode may be on a same layer. The first electrodes and the auxiliary electrode may include a same material.

The display device may include a pixel defining layer between at least two of the first electrodes, wherein the pixel defining layer may have a first opening exposing at least a portion of the auxiliary electrode and wherein the first charge generation layer may have a second opening overlapping the first opening. The second electrode may contact the auxiliary electrode at the first opening. The first opening may have a circular shape, a linear shape, or a lattice shape on a plane. The second opening may have a circular shape, a linear shape, or a lattice shape on a plane.

The display device may include at least one of a hole injection layer and a hole transport layer between the first electrodes and the first light emitting portion. The display device may include at least one of an electron transport layer and an electron injection layer between the second light emitting portion and the second electrode. The display device may include a third light emitting portion between the second light emitting portion and the second electrode. The display device may include a second charge generation layer between the second light emitting portion and the third light emitting portion. Each of the first charge generation layer and the second charge generation layer may include at least one of an n-type layer and a p-type layer.

The display device may include a capping layer on the second electrode; and a thin film encapsulation layer on the capping layer and including: at least one inorganic layer; and at least one organic layer alternately arranged with the at least one inorganic layer. The display device may include a capping layer on the second electrode; a filler on the capping layer; and an encapsulation substrate on the filler.

In accordance with one or more other embodiments, an apparatus includes an organic light emitting diode (OLED); and an auxiliary electrode adjacent to the OLED, wherein the OLED includes a charge generation layer between a first electrode and a second electrode and wherein the second electrode is electrically connected to the auxiliary electrode. The OLED may include a first light emitting portion; and a second light emitting portion, wherein the charge generation layer is between the first and second light emitting portions. The second electrode may be insulated from the charge generation layer. The charge generation layer may include an n-type layer and a p-type layer.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 1:
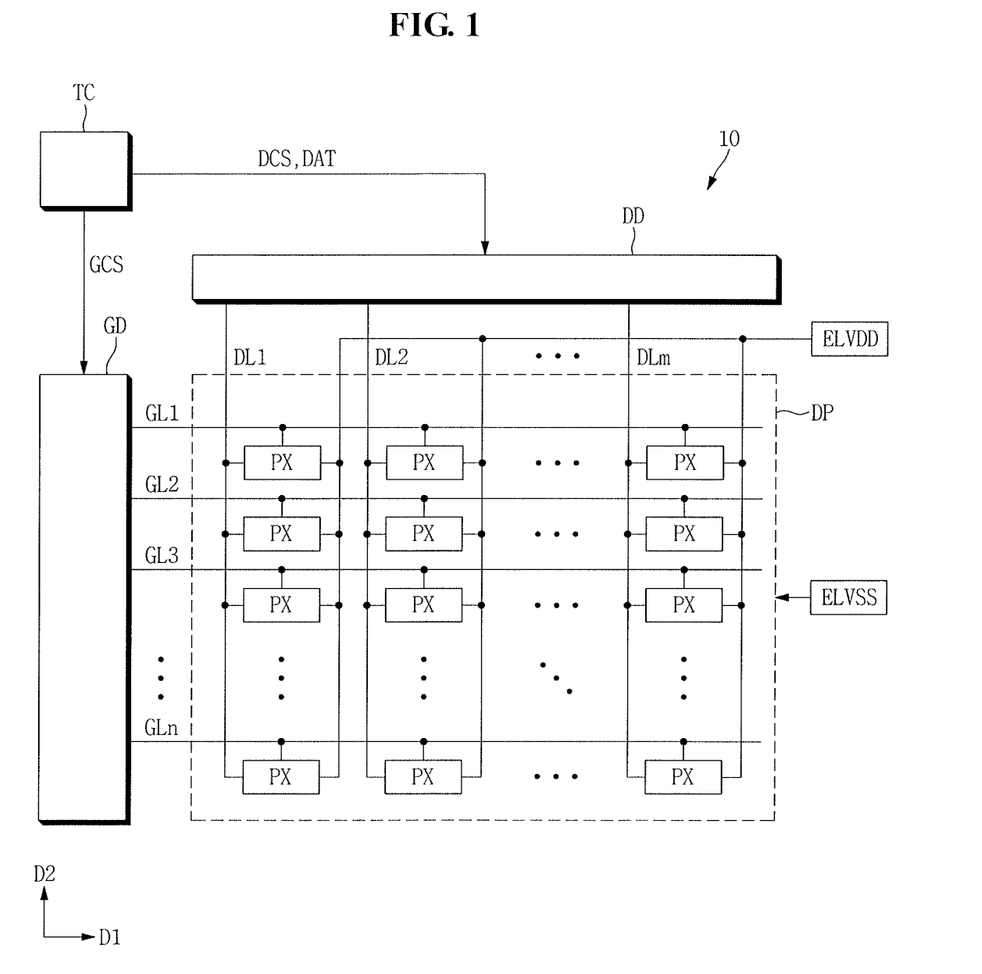
FIG. 1 illustrates an embodiment of an OLED display device.

FIG. 1 illustrates an embodiment of an OLED display device 10 which includes a display panel DP, a timing control unit TC, a gate driving unit GD and a data driving unit DD.

The timing control unit TC receives an image data from an external source and outputs, to the data driving unit DD, an image data signal DAT suitably converted in accordance with an operation mode of the display panel DP. In addition, the timing control unit TC generates a gate driving control signal GCS and a data driving control signal DCS using horizontal and/or vertical synchronization signals and a clock signal, and outputs the gate driving control signal GCS and the data driving control signal DCS to the gate driving unit GD and the data driving unit DD, respectively.

The gate driving unit GD receives the gate driving control signal GCS from the timing control unit TC and generates a plurality of gate signals. The gate signals are sequentially applied to the display panel DP.

The data driving unit DD receives the data driving control signal DCS and the converted image data signal DAT from the timing control unit TC. The data driving unit DD generates a plurality of data signals based on the data driving control signal DCS and the converted image data signal DAT. The data signals are applied to display panel DP.

The display panel DP may receive electric signals from an external source to display an image. The display panel DP includes a plurality of gate lines GL1 to GLn, a plurality of data lines DL1 to DLm insulated from and intersecting the gate lines GL1 to GLn and a plurality of pixels PX electrically connected to the gate lines GL1 to GLn and the data lines DL1 to DLm.

Each of the gate lines GL1 to GLn may extend along a first direction D1 and may be arranged along a second direction D2 that intersects the first direction D1. The gate lines GL1 to GLn sequentially receive the gate signal from the gate driving unit GD.

Each of the data lines DL1 to DLm may extend along the second direction D2 and may be arranged along the first direction D1. The data lines DL1 to DLm receive the data signal from the data driving unit DD.

The display panel DP may receive a first power voltage ELVDD and a second power voltage ELVSS from an external power source. Each of the pixels PX may be turned on based on a corresponding gate signal. Each of the pixels PX receives the first power voltage ELVDD and the second power voltage ELVSS and may generate a light based on a corresponding data signal. The first power voltage ELVDD may have a higher voltage level than that of the second power voltage ELVSS.

The pixels PX may be arranged, for example, in a matrix. The pixels PX may be connected to each corresponding one of the gate lines GL1 to GLn and may be connected to each corresponding one of the data lines DL1 to DLm.

Each of the pixels PX may receive a gate signal from each corresponding one of the gate lines GL1 to GLn and receive a data signal from each corresponding one of the data lines DL1 to DLm. Each of the pixels PX may be turned on based on each corresponding gate signal. Each of the pixels PX may generate a light corresponding to each corresponding data signal to display an image. The pixels PX may emit light of various colors, e.g., red light, green light, and blue light.

Figure 2:
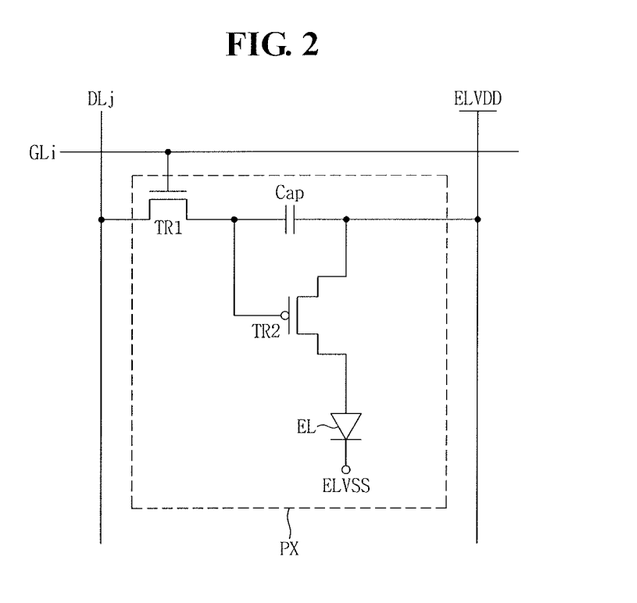
FIG. 2 illustrates an embodiment of a pixel.

FIG. 2 illustrates an embodiment of a pixel, which, for example, may be representative of the pixels PX of FIG. 1. For illustrative purposes, the pixel PX is connected to an i-th gate line GLi of the gate lines GL1 to GLn and a j-th data line DLj of the data lines DL1 to DLm.

Referring to FIG. 2, the pixel PX includes a first transistor TR1, a second transistor TR2, a capacitor Cap, and an OLED EL. The OLED display device 10 is an active matrix type organic light emitting diode ("AMOLED") display device having a 2Tr-1Cap structure in which each pixel PX includes two transistors and one capacitor. In another embodiment, the OLED display device 10 may have a different structure, e.g., three or more transistors and/or two or more capacitors with corresponding wirings.

The first transistor TR1 may include a control electrode connected to the gate line GLi, an input electrode connected to the data line DLj, and an output electrode. The first transistor TR1 may output a data signal flowing through the data line DLj based on the gate signal applied to the gate line GLi.

The capacitor Cap may include a first capacitor electrode connected to the first transistor TR1 and a second capacitor electrode receiving the first power voltage ELVDD. The capacitor Cap may charge electric charge of an amount corresponding to a difference between a voltage corresponding to the data signal applied from the first transistor TR1 and the first power voltage ELVDD.

The second transistor TR2 may include a control electrode connected to the output electrode of the first transistor TR1 and to the first capacitor electrode of the capacitor Cap, an input electrode receiving the first power voltage ELVDD, and an output electrode. The output electrode of the second transistor TR2 may be electrically connected to the OLED EL.

The second transistor TR2 may control a driving current flowing through the OLED EL in accordance with the amount of electric charge stored in the capacitor Cap. A turn-on period of the second transistor TR2 may be determined based on the amount of electric charge charged in the capacitor Cap. The output electrode of the second transistor TR2 may apply a voltage having a voltage level substantially lower than that of the first power voltage ELVDD to the OLED EL.

The OLED EL is connected to the second transistor TR2 and receives the second power voltage ELVSS. The OLED EL may emit light during the turn-on period of the second transistor TR2. The OLED EL may include a light emitting material. The OLED EL may generate a light of a color corresponding to the light emitting material. The color of the light generated in the OLED EL may be red, green, blue, white, or another color.

Figure 3:
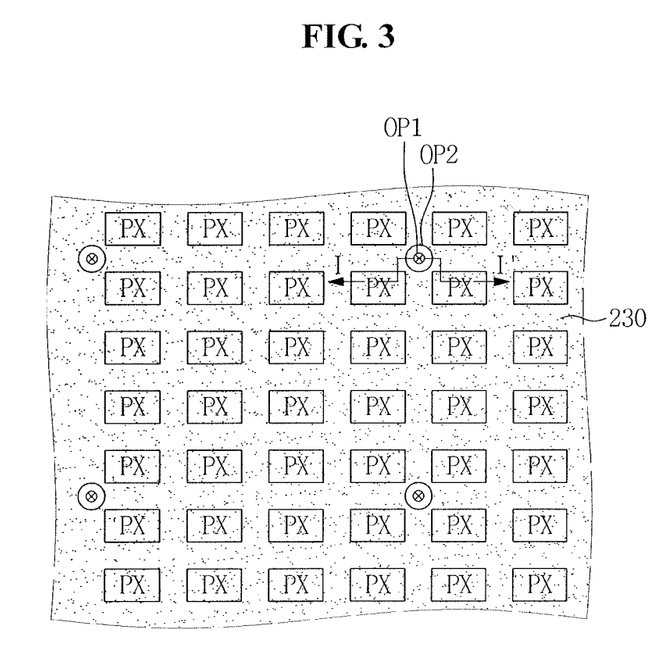
FIG. 3 illustrates another embodiment of an OLED display device.
Figure 4:
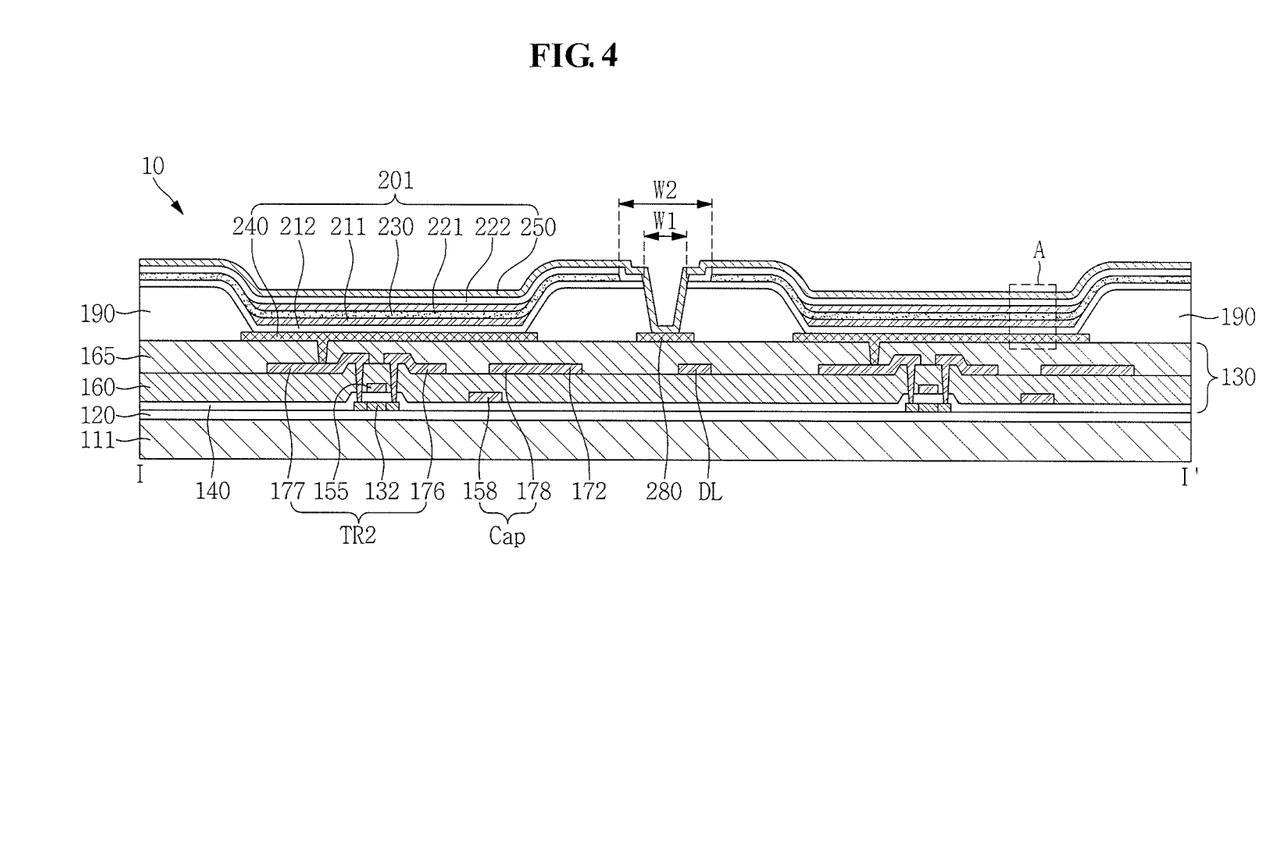
FIG. 4 illustrates a cross-sectional view taken along line I-I' of FIG. 3.
Figure 5:
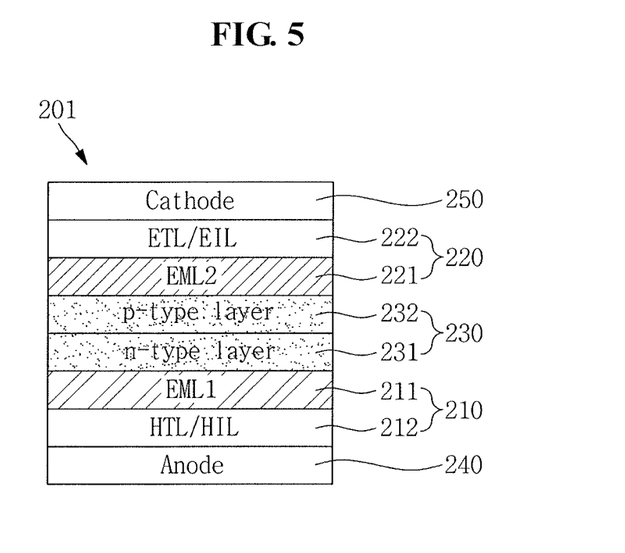
FIG. 5 illustrates a cross-sectional view enlarging an area "A" of FIG. 4.

FIG. 3 illustrates an embodiment of an enlarged portion of the pixel PX and a charge generation layer of the OLED display device 10. FIG. 4 illustrates a cross-sectional view taken along line I-I' of FIG. 3. FIG. 5 illustrates a cross-sectional view enlarging an area "A" of FIG. 4.

Referring to FIGS. 3, 4, and 5, the OLED display device 10 includes a base substrate 111, a driving circuit unit 130, and an OLED 201 (e.g., see FIG. 2). The base substrate 111 may include an insulating material including, for example, glass, quartz, ceramics, or plastic. In one embodiment, a polymer film may be used for the base substrate 111.

A buffer layer 120 is on the base substrate 111 and may include one or more layers including one or more inorganic layers and/or organic layers. In one embodiment, the buffer layer 120 may be omitted.

The driving circuit unit 130 is on the buffer layer 120 and may include a plurality of thin film transistors, for example, first and second thin film transistors TR1 and TR2 and a capacitor Cap. An example of the thin film transistor TR2 is illustrated in FIG. 4.

The thin film transistor TR2 drives the OLED 201. For example, the OLED 201 emits light corresponding to an image based on a driving signal from the driving circuit 130. The thin film transistor TR2 includes a semiconductor layer 132, a gate electrode 155, a source electrode 176, and a drain electrode 177. The semiconductor layer 132 and the gate electrode 155 are insulated by the gate insulating layer 140.

The capacitor Cap includes an insulating interlayer 160 between first and second capacitor plates 158 and 178. In such an exemplary embodiment, the insulating interlayer 160 may be a dielectric element. The capacitance of the capacitor Cap is determined based on electric charges accumulated in the capacitor Cap and a voltage across the pair of capacitor plates 158 and 178.

The semiconductor layer 132 is on the base substrate 111 on which the buffer layer 120 is disposed. The semiconductor layer 132 may include, for example, amorphous silicon, polycrystalline silicon, or another material. The semiconductor layer 132 may include an oxide semiconductor. The semiconductor layer 132 may include a source area heavily doped with an n-type impurity, a drain area heavily doped with a p-type impurity, and a channel area between the source area and the drain area.

The gate insulating layer 140 is on the semiconductor layer 132 and the buffer layer 120. The gate insulating layer 140 insulates the gate electrode 155 and the semiconductor layer 132 to be formed in a subsequent process. The gate insulating layer 140 may include or be formed of silicon nitride (SiNx) or silicon oxide (SiOx). In addition, the gate insulating layer 140 may have a multilayer structure including at least two insulating layers having different physical properties.

A gate electrode 155 is on the gate insulating layer 140 and, or example, may be integrally formed with the gate line GLi (e.g., see FIG. 2). In addition, the gate electrode 155, the gate line GLi, and the first capacitor electrode 158 may be formed in a substantially same process. The gate electrode 155 may include or be formed of, for example, aluminum (Al) or alloys thereof, silver (Ag) or alloys thereof, copper (Cu) or alloys thereof, or molybdenum (Mo) or alloys thereof, chromium (Cr), tantalum (Ta), and/or titanium (Ti). In an exemplary embodiment, the gate electrode 155 may have a multilayer structure having at least two conductive layers with different physical properties.

The insulating interlayer 160 is on the gate electrode 155, the gate line GLi, the first capacitor electrode 158, and the gate insulating layer 140. The insulating interlayer 160 may include or be formed of an inorganic insulating material such as silicon nitride (SiNx) or silicon oxide (SiOx). In one embodiment, the insulating interlayer 160 may include an organic layer. The insulating interlayer 160 may have a bilayer structure including a lower inorganic layer and an upper organic layer. The insulating interlayer 160 may have a plurality of contact holes.

The source electrode 176 and the drain electrode 177 are spaced apart from each other on the insulating interlayer 160. The source electrode 176 and the drain electrode 177 are electrically connected to the semiconductor layer 132 through a contact hole in the insulating interlayer 160. The source electrode 176, the drain electrode 177, the second capacitor electrode 178, the common power line 172, and the data line DL may be formed in a substantially same process.

A planarization layer 165 is on the source electrode 176, the drain electrode 177, the second capacitor electrode 178, the common power line 172, the data line DL, and the insulating interlayer 160. The planarization layer 165 may include an insulating material and serves to protect the driving circuit unit 130. The planarization layer 165 and the insulating interlayer 160 may include a substantially same material.

With the aforementioned structure, the first transistor TR1 (e.g., see FIG. 2) is driven by a gate voltage applied to the gate line GLi and serves to transmit a data voltage applied to the data line DL to the second transistor TR2. A voltage equivalent to a difference between a common voltage applied to the second transistor TR2 from the common power line 172 and the data voltage transmitted from the first transistor TR1 is stored in the capacitor Cap and a current corresponding to the voltage stored in the capacitor Cap flows to the OLED 210 through the second transistor TR2, such that the OLED 210 may emit light.

Referring to FIGS. 4 and 5, the OLED 201 includes a plurality of first electrodes 240 on the base substrate 111, an auxiliary electrode 280 spaced apart from the first electrodes 240, a first light emitting portion (or area) 210 on the first electrodes 240, a first charge generation layer 230 on the first light emitting portion 210, a second light emitting portion (or area) 220 on the first charge generation layer 230, and a second electrode 250 on the second light emitting portion 220. The first light emitting portion 210 includes a first organic emissive layer 211 between the first electrode 240 and the first charge generation layer 230. In addition, the second light emitting portion 220 includes a second organic emissive layer 221 between the first charge generation layer 230 and the second electrode 250.

Holes and electrons are injected into the first and second light emitting portions 210 and 220 from the first and second electrodes 240 and 250, respectively, to be combined with each other to form an exciton. When the excitons fall from an excited state to a ground state, light emission occurs.

The OLED 201 has a tandem structure in which the two light emitting portions 210 and 220 are connected in series. In such an exemplary embodiment, the first light emitting portion 210 is adjacent to the first electrode 240 and the second light emitting portion 220 is adjacent to the second electrode 250. According to the present exemplary embodiment, the first electrode 240 is an anode and the second electrode 250 is a cathode. In another embodiment, the first electrode 240 may be a cathode and the second electrode 250 may be an anode.

The first electrode 240 may be a transmissive electrode having light transmittance or a reflective electrode having light reflectivity. The second electrode 250 may be formed as a semi-transmissive layer or a reflective layer. In the present embodiment, the first electrode 240 is a reflective electrode and the second electrode 250 is a semi-transmissive electrode. Accordingly, the light generated in the first and second light emitting portions 210 and 220 passes through the second electrode 250 to be emitted.

The auxiliary electrode 280 is spaced apart from the first electrodes 240. For example, the auxiliary electrode 280 may be between at least two first electrodes 240. The auxiliary electrode 280 may have a predetermined shape, e.g., a circle, a line, a lattice on a plane, or another shape or configuration.

The auxiliary electrode 280 and the first electrode 240 may include a substantially same material and be on a substantially same layer. The first electrode 240 and the auxiliary electrode 280 may be formed, for example, in a substantially same process.

According to an exemplary embodiment, one of the first organic emissive layer 211 and the second organic emissive layer 221 is a blue emissive layer and the other thereof is a yellow emissive layer. In one embodiment, the OLED 201 may be a white organic light emitting diode ("WOLED") that emits white light.

For example, the first organic emissive layer 211 of FIG. 5 is a blue emissive layer including a blue light emitting material. The second organic emissive layer 221 of FIG. 5 is a yellow emissive layer including a yellow light emitting material. In one embodiment, the first organic emissive layer 211 may be a yellow emissive layer and the second organic emissive layer 221 may be a blue emissive layer.

The OLED 201 may further include a first auxiliary emissive layer 212 between the first electrode 240 and the first organic emissive layer 211. The first auxiliary emissive layer 212 may include at least one of a hole injection layer HIL and a hole transport layer HTL. The first auxiliary emissive layer 212 may include both of the hole injection layer HIL and the hole transport layer HTL.

In addition, the OLED 201 may include a second auxiliary emissive layer 222 between the second organic emissive layer 221 and the second electrode 250. The second auxiliary emissive layer 222 may include at least one of an electron transport layer ETL and an electron injection layer EIL. The second auxiliary emissive layer 222 may include both of the electron injection layer EIL and the electron transport layer ETL. Since the first and second organic emissive layers 211 and 221, the hole injection layer HIL, the hole transport layer HTL, the electron transport layer ETL, and the electron injection layer EIL may include an organic material, they may be referred to as an organic layer.

The first charge generation layer 230 is between the first light emitting portion 210 and the second light emitting portion 220. The first charge generation layer 230 controls charges between the first light emitting portion 210 and the second light emitting portion 220, so that charge balance between the first light emitting portion 210 and the second light emitting portion 220 may be achieved.

The first charge generation layer 230 includes an n-type layer 231 adjacent to the first light emitting portion 210, to supply electrons to the first light emitting portion 210, and a p-type layer 232 adjacent to the second light emitting portion 220 to supply holes to the second light emitting portion 220. In one embodiment, the first charge generation layer 230 may include only one of the n-type layer and the p-type layer. The first charge generation layer 230 may include, for example, a metal such as aluminum (Al) or a transparent conductive material such as indium tin oxide (ITO).

The first charge generation layer 230 may be formed, for example, by doping an organic material with an n-type material and a p-type material. For example, in order to facilitate the electron supply, the n-type layer 231 may be formed by doping the organic material with the n-type material. In addition, in order to facilitate the hole supply, the p-type layer 232 may be formed by doping the organic material with the p-type material.

When a voltage is applied between the first electrode 240 and the second electrode 250 of the OLED 201, electrons generated at the n-type layer 231 move to the first light emitting portion 210, and holes are injected to the first light emitting portion 210 from the first electrode 240. The electrons and holes meet at the first light emitting portion 210 to emit light.

In addition, electrons are injected to the second light emitting portion 220 from the second electrode 250, and holes generated at the p-type layer 232 to move to the second light emitting portion 220. The electrons and holes meet at the second light emitting portion 220 to emit light.

A color filter may be on the second electrode 250. In such an exemplary embodiment, the color filter may overlap the OLED 201. For example, a red color filter, a green color filter, and a blue color filter may be independently arranged in the respective OLEDs 201. The OLED display device 10 may realize various colors using the OLED 201 and the color filter.

A pixel defining layer 190 is between the first electrodes 240 and has a pixel opening and a first opening OP1. The pixel opening exposes a portion of the first electrode 240 and the first opening OP1 exposes a portion of the auxiliary electrode 280.

The first electrode 240, the first light emitting portion 210, the first charge generation layer 230, the second light emitting portion 220, and the second electrode 250 are sequentially stacked at the pixel opening of the pixel defining layer 190. The OLED 201 emits light in the first and second organic emissive layers 211 and 221 at the pixel opening of the pixel defining layer 190. In such a manner, the pixel defining layer 190 may define a light emitting area.

The second electrode 250 is not only on the first and second light emitting portions 210 and 220, but also on the pixel defining layer 190, and is electrically connected to the auxiliary electrode 280 through the first opening OP1. Accordingly, a voltage is applied from the auxiliary electrode 280 to the second electrode 250 to substantially prevent or reduce a voltage drop of the second electrode 250. Accordingly, the OLED display device 10 according to an exemplary embodiment may have a uniform luminance.

A hole injection layer HIL, a hole transport layer HTL, an electron transport layer ETL, and an electron injection layer EIL may be between the pixel defining layer 190 and the second electrode 250. In such an exemplary embodiment, the hole injection layer HIL, the hole transport layer HTL, the electron transport layer ETL, and the electron injection layer EIL may contact at least a portion of the second electrode 250.

In addition, the first charge generation layer 230 may be between the pixel defining layer 190 and the second electrode 250. In such an exemplary embodiment, the first charge generation layer 230 according to an exemplary embodiment does not contact the second electrode 250.

The first charge generation layer 230 according to an exemplary embodiment may be patterned using a mask. In such an exemplary embodiment, a fine metal mask (FMM) may be used as the mask. As illustrated in FIGS. 3 and 4, the patterned first charge generation layer 230 has a second opening OP2 and the second opening OP2 overlaps the first opening OP1. Although the first and second openings OP1 and OP2 according to a first exemplary embodiment are depicted as having a circular shape on a plane, the first and second openings OP1 and OP2 may have a different shape in another embodiment.

The second opening OP2 of the first charge generation layer 230 is larger than the width of the first opening OP1 of the pixel defining layer 190. For example, as illustrated in FIG. 4, when the width of an upper surface of the second opening OP2 is defined as a second width W2 and the width of an upper surface of the first opening OP1 is defined as a first width W1, the second width W2 is greater than the first width W1. Accordingly, the first charge generation layer 230 may be insulated from the second electrode 250.

The first charge generation layer 230 according to an exemplary embodiment is insulated from the second electrode 250, such that a leakage current due to a contact between the first charge generation layer 230 and the second electrode 250 may be substantially reduced or prevented. Accordingly, the OLED display device 10 according to an embodiment may have a uniform luminance.

Figure 6:
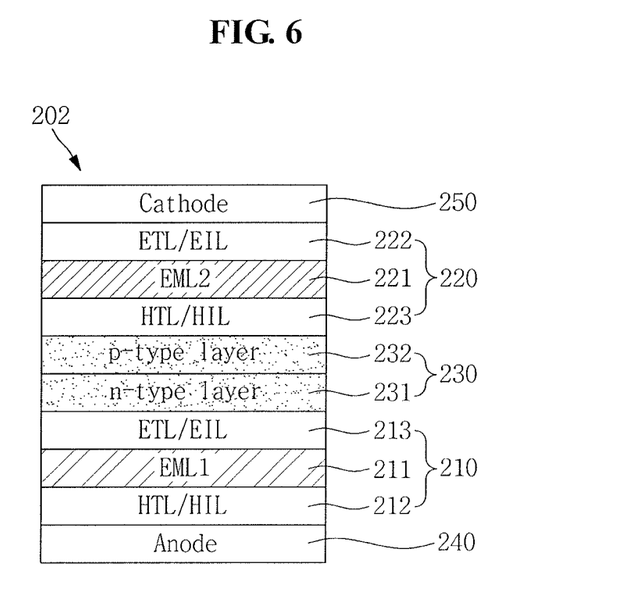
FIG. 6 illustrates another embodiment of an OLED display device.

FIG. 6 illustrates a cross-sectional view of another embodiment of the area "A" of FIG. 4. Referring to FIG. 6, an OLED 202 according to this embodiment is different from the OLED 201 according to the previous embodiment in that the OLED 202 further includes a third auxiliary emissive layer 213 between a first organic emissive layer 211 and a first charge generation layer 230. The third auxiliary emissive layer 213 may include at least one of an electron transport layer ETL and an electron injection layer EIL. The third auxiliary emissive layer 213 may include both of the electron injection layer EIL and the electron transport layer ETL.

In addition, the OLED 202 may further include a fourth auxiliary emissive layer 223 between the first charge generation layer 230 and a second organic emissive layer 221. The fourth auxiliary emissive layer 223 may include at least one of a hole injection layer HIL and a hole transport layer HTL. The fourth auxiliary emissive layer 223 may include both of the hole injection layer HIL and the hole transport layer HTL.

Since the OLED 202 according to the present exemplary embodiment includes the third light auxiliary emissive layer 213 and the fourth light auxiliary emissive layer 223, light emission efficiency of the first and second organic emissive layers 211 and 221 may be improved.

Figure 7:
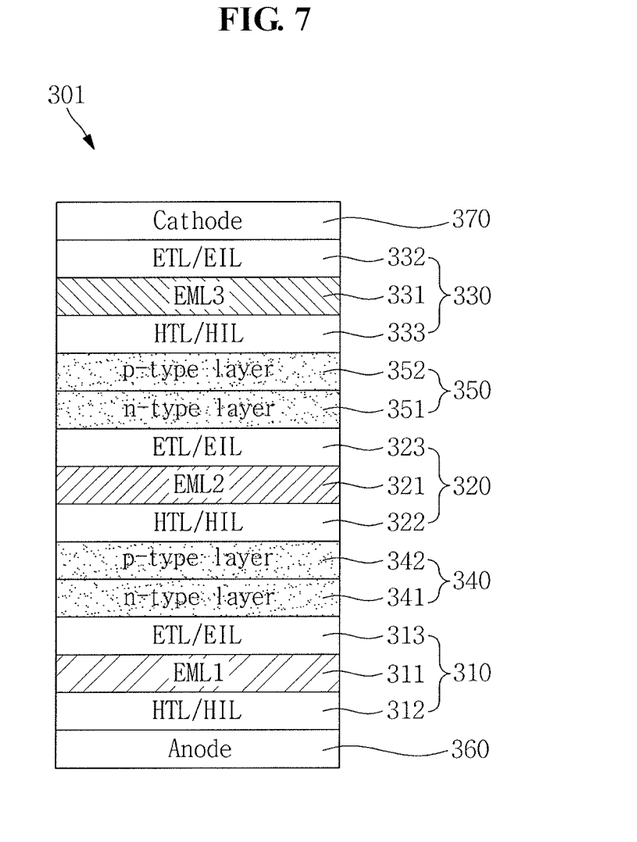
FIG. 7 illustrates another embodiment of an OLED display device.

FIG. 7 illustrates a cross-sectional view of another embodiment of area "A" of FIG. 4. Referring to FIG. 7, an OLED 301 according to this exemplary embodiment includes three light emitting portions 310, 320, and 330 arranged in series and first and second charge generation layers 340 and 350 between each of the light emitting portions 310, 320, and 330.

The OLED 301 includes a first electrode 360, a first light emitting portion 310, a first charge generation layer 340, a second light emitting portion 320, a second charge generation layer 350, a third light emitting portion 330, and a second electrode 370 that are sequentially disposed. The first electrode 360 may be an anode and the second electrode 370 may be a cathode. In another embodiment, the first electrode 360 may be a cathode and the second electrode 370 may be an anode.

The first light emitting portion 310 includes a first auxiliary emissive layer 312, a first organic emissive layer 311, and a second auxiliary emissive layer 313. The second light emitting portion 320 includes a third auxiliary emissive layer 322, a second organic emissive layer 321, and a fourth auxiliary emissive layer 323. The third light emitting portion 330 includes a fifth auxiliary emissive layer 333, a third organic emissive layer 331, and a sixth auxiliary emissive layer 332.

The first, third, and fifth auxiliary emissive layers 312, 322, and 333 may include at least one of a hole injection layer HIL and a hole transport layer HTL or may include both of the hole injection layer HIL and the hole transport layer HTL.

The second, fourth, and sixth auxiliary emissive layers 313, 323, and 332 may include at least one of an electron transport layer ETL and an electron injection layer EIL or may include both of the electron transport layer ETL and the electron injection layer EIL. Respective ones of the first and second charge generation layers 340 and 350 include n-type layers 341 and 351 and p-type layers 342 and 352. The first and second charge generation layers 340 and 350 may not contact the second electrode 370.

The OLED 301 of FIG. 7 is a white organic light emitting diode (WOLED) that emits white light. Each of the first light emitting portion 310, the second light emitting portion 320, and the third light emitting portion 330 may emit light having one of red, green, and blue colors.

In one embodiment, two of the first light emitting portion 310, the second light emitting portion 320, and the third light emitting portion 330 may emit blue light and the other may emit yellow light. In one embodiment, two of the first light emitting portion 310, the second light emitting portion 320, and the third light emitting portion 330 may emit yellow light and the other thereof may emit blue light.

Figure 8:
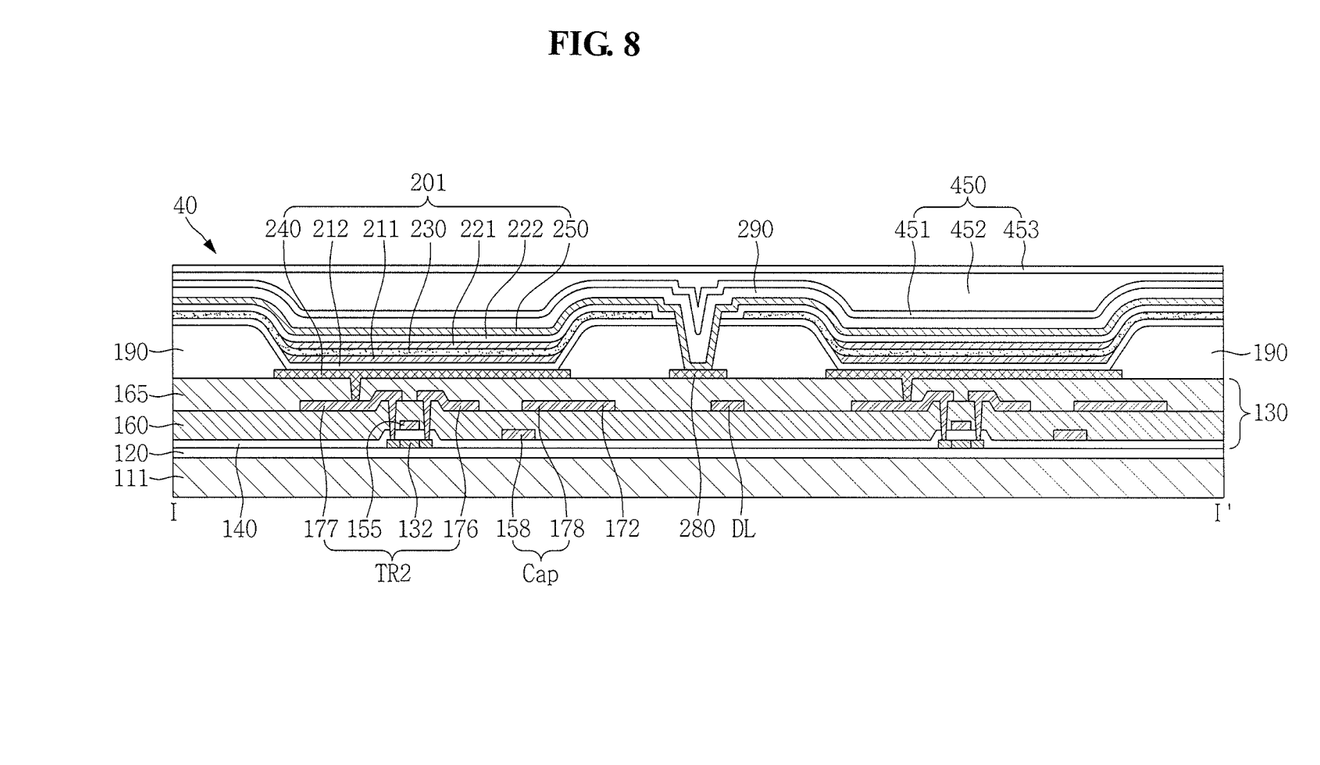
FIG. 8 illustrates another embodiment of an OLED display device.

FIG. 8 illustrates a cross-sectional view of another embodiment of an OLED display device 40, which includes a capping layer 290 and a thin film encapsulation layer 450 on an OLED 201. The capping layer 290 serves to protect the OLED 201 and allows light generated in first and second organic emissive layers 211 and 221 to be emitted in an outward direction efficiently.

The capping layer 290 may include at least one of an inorganic material and an organic material having light transmittance. For example, the capping layer 290 may include an inorganic layer or an organic layer or may include an organic layer including inorganic particles.

In addition, the capping layer 290 may include two or more materials having different refractive indices. For example, the capping layer 290 may be formed using a mixture of a high refractive index material and a low refractive index material. The high refractive index material and the low refractive index material may be an organic material or an inorganic material.

The capping layer 290 may have a thickness ranging, for example, from about 30 nm to about 300 nm or may have a thickness of about 300 nm or more. As the thickness of the capping layer 290 increases, the OLED 201 may be protected to a greater extent. However, a thick capping layer 290 may make it difficult to slim down the OLED display device 40.

The thin film encapsulation layer 450 includes one or more inorganic layers 451 and 453 and one or more organic layers 452. For example, the thin film encapsulation layer 450 has a structure in which at least one inorganic layer 451 and 453 and at least one organic layer 452 are alternately stacked. According to an exemplary embodiment, the thin film encapsulation layer 450 includes two inorganic layers 451 and 453 and one organic layer 452. The thin film encapsulation layer 450 may have a different structure in another embodiment.

The inorganic layers 451 and 453 include one or more inorganic materials of $Al_2O_3$, $TiO_2$, $ZrO$, $SiO_2$, AlON, AlN, SiON, $Si_3N4$, ZnO, and $Ta_2O_5$. The inorganic layers 451 and 453 may be formed through methods such as a chemical vapor deposition (CVD) method or an atomic layer deposition (ALD) method. The inorganic layers 451 and 453 may be formed using different methods in another embodiment.

The organic layer 452 may include, for example, a polymer-based material. Examples of the polymer-based material includes an acrylic resin, an epoxy resin, polyimide, and polyethylene. The organic layer 452 may be formed through a thermal deposition process. The thermal deposition process for forming the organic layer 452 may be performed in a temperature range that may not damage the OLED 201. The organic layer 452 may be formed using different methods in another embodiment.

The inorganic layers 451 and 453 which have a high density of thin layer may substantially prevent or efficiently reduce infiltration of, for example, moisture or oxygen. Permeation of moisture and oxygen into the OLED 201 may be largely prevented by the inorganic layers 451 and 453.

Moisture and oxygen that have passed through the inorganic layers 451 and 453 may further be blocked by the organic layer 452. The organic layer 452 may also serve as a buffer layer to reduce stress between each of the inorganic layers 451 and 453, in addition to the moisture infiltration preventing function. Further, since the organic layer 452 has planarization characteristics, an uppermost surface of the thin film encapsulation layer 450 may be planarized by the organic layer 452.

The thin film encapsulation layer 450 may have a thickness, for example, that is less than or equal to about 10 μm. Accordingly, the OLED display device 40 may also have a predetermined reduced thickness. Such an OLED display device 40 may have flexible characteristics.

Figure 9:
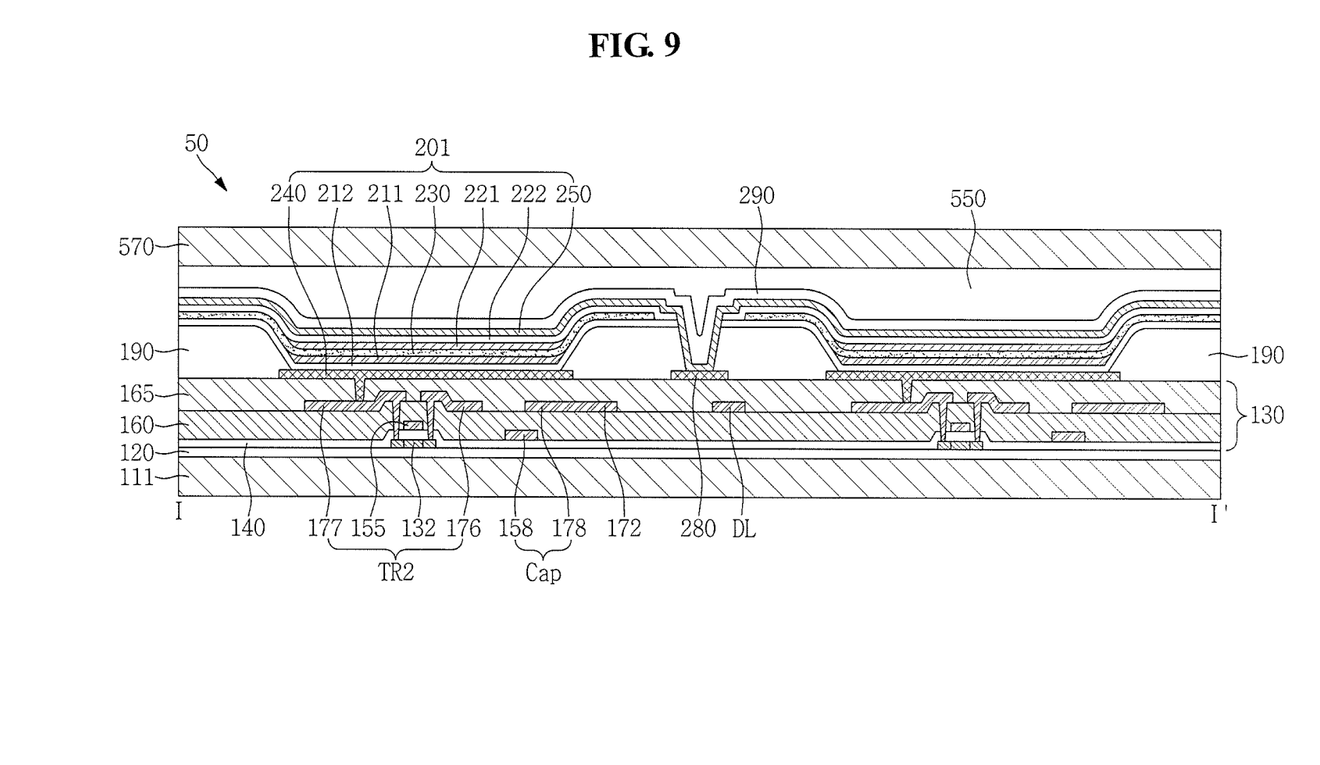
FIG. 9 illustrates another embodiment of an OLED display device.

FIG. 9 illustrates a cross-sectional view of another embodiment of an OLED display device 50, which includes a capping layer 290 on an OLED 201, a filler 550 on the capping layer 290, and an encapsulation substrate 570 on the filler 550.

The encapsulation substrate 570 is a transparent insulating substrate including glass, quartz, ceramics, plastic, or another material. The encapsulation substrate 570 is sealingly attached to a base substrate 110 to protect the OLED 210.

The filler 550 may include an organic material, for example, a polymer. The filler 550 may have a refractive index greater than or less than that of the capping layer 290. In one embodiment, the filler 550 may have a substantially equal refractive index to that of the capping layer 290.

The filler 550 may be selected according to the refractive indices of the capping layer 290 and the encapsulation substrate 570. For example, when the encapsulation substrate 570 is a glass substrate having a refractive index of about 1.5, a polymer having a refractive index of about 1.5 may be used as a material for the filler 550. The material for the filler 550 may include poly (methyl methacrylate) (PMMA), for example.

Since the filler 550 fills a space between the capping layer 290 and the encapsulation substrate 570, the device strength and durability of the OLED display device 50 may be improved by the filler 550.

Figure 10:
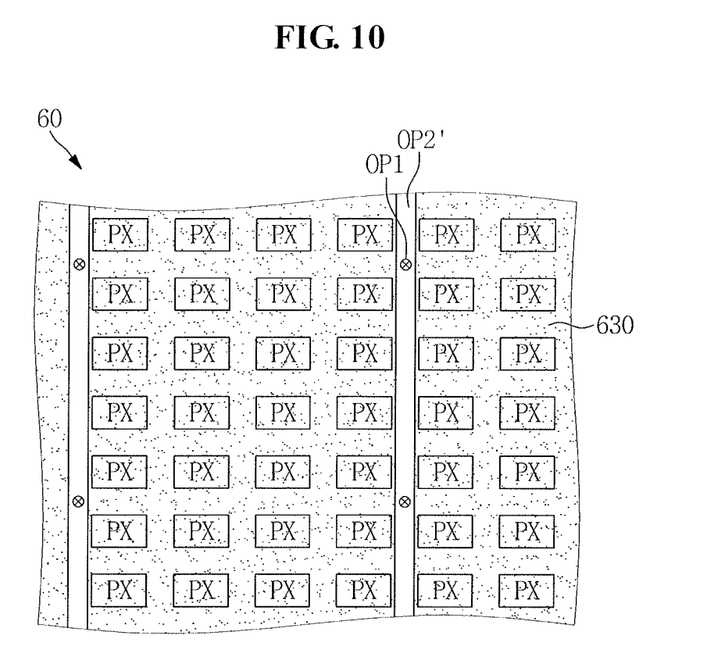
FIG. 10 illustrates another embodiment of an OLED display device.

FIG. 10 illustrates another embodiment of an OLED display device 60. Referring to FIG. 10, the OLED display device 60 has a first charge generation layer 630 with a second opening OP2'.

The first charge generation layer 630 may be patterned using a mask. In such an exemplary embodiment, a fine metal mask (FMM) may be used as a mask. As illustrated in FIG. 10, the patterned first charge generation layer 630 has the second opening OP2' having a shape of a line on a plane and the second opening OP2' overlaps a first opening OP1. The second opening OP2' of the first charge generation layer 630 is larger than a width of the first opening OP1 of a pixel defining layer 190 (e.g., see FIG. 4). Accordingly, the first charge generation layer 630 may be insulated from a second electrode 250 (e.g., see FIG. 4).

Since the first charge generation layer 630 is insulated from the second electrode 250, leakage current due to a contact between the first charge generation layer 630 and the second electrode 250 may be substantially reduced or prevented. Accordingly, the OLED display device 60 may have a uniform luminance.

Figure 11:
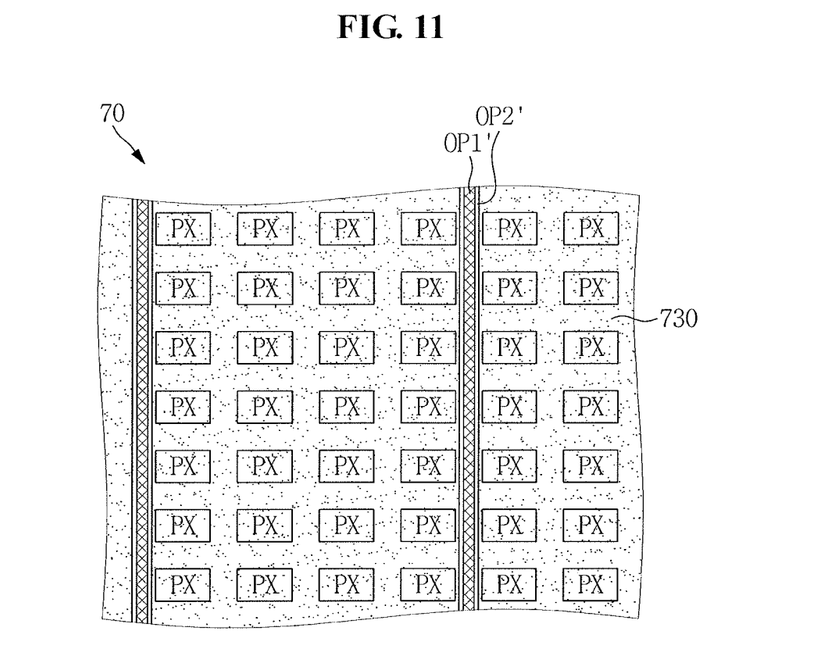
FIG. 11 illustrates another embodiment of an OLED display device.

FIG. 11 illustrates another embodiment of an OLED display device 70 which includes a charge generation layer. Referring to FIG. 11, the OLED display device 70 includes a pixel defining layer 190 (e.g., see FIG. 4) with a first opening OP1' and a first charge generation layer 730 with a second opening OP2'.

As illustrated in FIG. 11, the pixel defining layer 190 has the first opening OP1' having a shape of a line on a plane. Accordingly, a contact area between an auxiliary electrode 280 (e.g., see FIG. 4) and a second electrode 250 (e.g., see FIG. 4) increases, and thus a voltage may be easily transmitted from the auxiliary electrode 280 to the second electrode 250.

The second opening OP2' of the first charge generation layer 730 is larger than a width of the first opening portion OP1' of the pixel defining layer 190. Accordingly, the first charge generation layer 730 may be insulated from the second electrode 250.

Since the first charge generation layer 730 is insulated from the second electrode 250, leakage current due to a contact between the first charge generation layer 730 and the second electrode 250 may be substantially reduced or prevented. Accordingly, the OLED display device 70 may have a uniform luminance.

Figure 12:
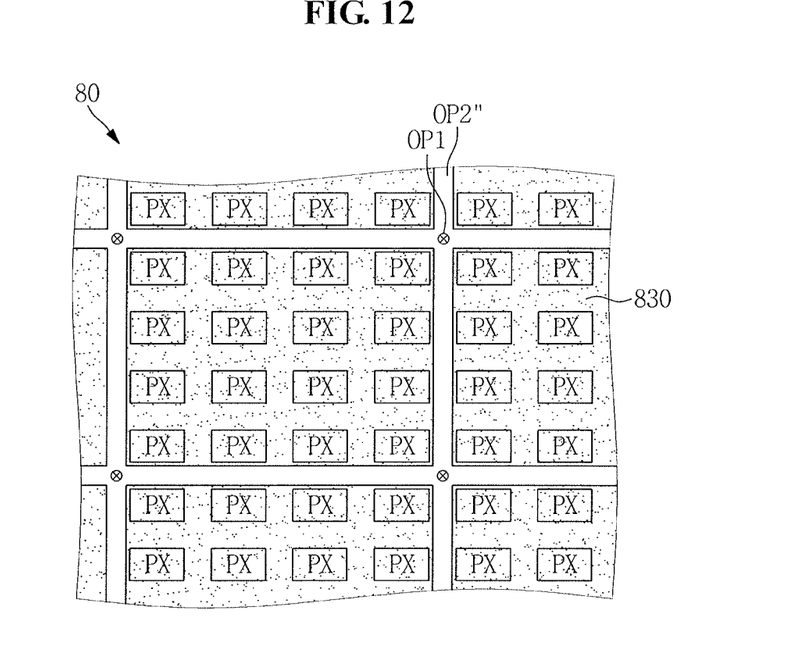
FIG. 12 illustrates another embodiment of an enlarged portion of a pixel and a charge generation layer.

FIG. 12 illustrates another embodiment of ab OLED display device 80 which includes a charge generation layer. Referring to FIG. 12, the OLED display device 80 includes a first charge generation layer 830 with a second opening OP2".

The first charge generation layer 830 may be patterned using a mask. In such an exemplary embodiment, a fine metal mask (FMM) may be used as the mask. As illustrated in FIG. 12, the patterned first charge generation layer 830 has the second opening OP2" and the second opening OP2" overlaps a first opening OP1.

Further, although the first opening OP1 according to the present exemplary embodiment is depicted as having a circular shape on a plane, the first opening OP1 may have a lattice shape as the second opening OP2" or another shape.

The second opening OP2" of the first charge generation layer 830 is larger than a width of the first opening OP1 of a pixel defining layer 190 (e.g., see FIG. 4). Accordingly, the first charge generation layer 830 may be insulated from a second electrode 250 (e.g., see FIG. 4).

Since the first charge generation layer 830 is insulated from the second electrode 250, leakage current due to a contact between the first charge generation layer 830 and the second electrode 250 may be substantially reduced or prevented. Accordingly, the OLED display device 80 may have a uniform luminance.

By way of summation and review, at least two types of OLED displays have been developed: a bottom emission type and a top emission type. Aperture ratio may be greater in a top emission type OLED display than in a bottom emission type OLED display. In a top emission type OLED display, the cathode electrode of the OLED in each pixel may be transparent and conductive for transmitting light. The cathode electrode may be relatively thin in an attempt to improve transmittance, but resistance of the cathode electrode may be high. This high resistance may cause a significant voltage drop that produces non-uniformity in luminance of the images output on the display.

In accordance with one or more embodiments, the OLED display device may have a uniform luminance by connecting a second electrode to an auxiliary electrode and insulating the second electrode from the charge generation layer.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. An organic light emitting diode display device, comprising:
    a substrate;
    a plurality of first electrodes on the substrate;
    a pixel defining layer to define a light emitting area;
    an auxiliary electrode on the substrate and spaced apart from the first electrodes;
    a first light emitting portion on the first electrode;
    a first charge generation layer on the first light emitting portion, the first charge generation layer extending from the light emitting area to an upper surface of the pixel defining layer;
    a second light emitting portion on the first charge generation layer; and
    a second electrode on the second light emitting portion and electrically connected to the auxiliary electrode, wherein
    a first opening is defined by the pixel defining layer and exposes at least a portion of the auxiliary electrode between at least two of the first electrodes,
    a second opening is defined by the first charge generation layer and overlaps the first opening, a side surface of the first charge generation layer exposed by the second opening is on the upper surface of the pixel defining layer,
    a third opening is defined by the second light emitting portion and overlaps the first and second openings,
    the second electrode is connected to the auxiliary electrode through the first, second and third openings,
    a width of the second opening is greater than a width of the third opening, and
    the second light emitting portion covers an upper surface and the side surface of the first charge generation layer in a cross-section view, and
    the pixel defining layer covers a side of the auxiliary electrode.

2. The display device as claimed in claim 1, wherein the first charge generation layer does not contact the second electrode.

3. The display device as claimed in claim 1, wherein the first electrodes and the auxiliary electrode are on a same layer.

4. The display device as claimed in claim 1, wherein the first electrodes and the auxiliary electrode include a same material.

5. The display device as claimed in claim 1, wherein a width of the second opening is greater than a width of the first opening, and the width of the third opening is substantially equal to the width of the first opening.

6. The display device as claimed in claim 5, wherein the second electrode contacts the auxiliary electrode at the first opening.

7. The display device as claimed in claim 5, wherein the first opening has a circular shape, a linear shape, or a lattice shape on a plane.

8. The display device as claimed in claim 5, wherein the second opening has a circular shape, a linear shape, or a lattice shape on a plane.

9. The display device as claimed in claim 1, further comprising:
    at least one of a hole injection layer and a hole transport layer between the first electrodes and the first light emitting portion.

10. The display device as claimed in claim 1, further comprising:
    at least one of an electron transport layer and an electron injection layer between the second light emitting portion and the second electrode.

11. The display device as claimed in claim 1, further comprising:
    a third light emitting portion between the second light emitting portion and the second electrode.

12. The display device as claimed in claim 11, further comprising:
    a second charge generation layer between the second light emitting portion and the third light emitting portion.

13. The display device as claimed in claim 12, wherein each of the first charge generation layer and the second charge generation layer include at least one of an n-type layer and a p-type layer.

14. The display device as claimed in claim 1, further comprising:
    a capping layer on the second electrode; and
    a thin film encapsulation layer on the capping layer and including:
        at least one inorganic layer; and
        at least one organic layer alternately arranged with the at least one inorganic layer.

15. The display device as claimed in claim 1, further comprising:
    a capping layer on the second electrode;
    a filler on the capping layer; and
    an encapsulation substrate on the filler.

* * * * *